(12) United States Patent
Nakamura

(10) Patent No.: US 6,900,131 B2
(45) Date of Patent: May 31, 2005

(54) METHOD OF MANUFACTURING SEMICONDUCTOR DEVICE

(75) Inventor: Makiko Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 56 days.

(21) Appl. No.: 10/425,875

(22) Filed: Apr. 30, 2003

(65) Prior Publication Data

US 2004/0058524 A1 Mar. 25, 2004

(30) Foreign Application Priority Data

Sep. 20, 2002 (JP) ........................................ 2002-275623

(51) Int. Cl.⁷ ...................... H01L 21/425; H01L 21/22; H01L 21/4763; H01L 21/44
(52) U.S. Cl. ...................... 438/685; 438/514; 438/530; 438/542; 438/627; 438/643; 438/648; 438/653; 438/656; 438/658; 438/659; 438/660; 438/687; 438/688
(58) Field of Search ................. 438/685, 687, 438/688

(56) References Cited

U.S. PATENT DOCUMENTS

| | | | | |
|---|---|---|---|---|
| 6,583,070 B1 | * | 6/2003 | Tsui et al. ................... | 438/783 |
| 2003/0008495 A1 | * | 1/2003 | Hsue et al. .................. | 438/627 |
| 2004/0150109 A1 | * | 8/2004 | Ahn et al. ................... | 257/751 |

FOREIGN PATENT DOCUMENTS

| JP | 05-065640 | 3/1993 |
|---|---|---|
| JP | 08-306690 | 11/1996 |

* cited by examiner

*Primary Examiner*—Carl Whitehead, Jr.
*Assistant Examiner*—David Hogans
(74) *Attorney, Agent, or Firm*—Rabin & Berdo, P.C.

(57) ABSTRACT

The present invention provides a method of manufacturing a semiconductor device, which is capable of reducing variations in the rate of occurrence of failures at individual connecting portions in the semiconductor device. According to the semiconductor device manufacturing method, a Cu-containing TiN layer, which serves as a cap layer (130 (310)), is formed using a Cu-containing Ti target. Cu contained in the Cu-containing TiN layer is diffused into an Al—Cu wiring (120 (320)) located in a portion electrically connected to an interlayer wiring (200) by heat treatment.

20 Claims, 6 Drawing Sheets

METHOD OF MANUFACTURING SEMICONDUCTOR DEVICE

BACKGROUND OF THE INVENTION

1. Field of the Invention

The present invention relates to a semiconductor device, and, particularly, to a method of manufacturing a semiconductor device having a multilayered wiring structure.

2. Description of the Related Art

Configuration of Semiconductor Device Comprised of Multilayered Wiring

In a semiconductor device having a multilayered wiring layer in which Al—Cu wirings added with Cu in Al to suppress failures caused by electromigration are laminated, a connecting portion between two wiring layers generally has such a configuration as shown in FIG. 2, for example.

FIG. 2 is a typical cross-sectional view showing one example of a partial structure of a semiconductor device having a structure wherein wiring layers are laminated. Described specifically, the present figure illustrates two wiring layers insulated and isolated from each other by an interlayer insulating layer, and an electrically-connected portion between these two wiring layers.

In FIG. 2, reference numeral 120 indicates a first wiring layer (Al—Cu wiring), reference numeral 200 indicates an interlayer wiring, reference numeral 320 indicates a second wiring layer (Al—Cu wiring), reference numerals 110, 130, 310 and 330 indicate cap layers, and reference numerals 400, 401 and 402 indicate interlayer insulating layers, respectively. An upper surface (as viewed in the direction opposite to arrow S) of the first wiring layer 120 in the neighborhood of an end thereof, and the interlayer wiring 200 are electrically connected each other with the cap layer 130 interposed therebetween. A lower surface (corresponding to a surface as viewed in the direction indicated by arrow S) of the second wiring layer 320 in the neighborhood of an end thereof, and the interlayer wiring 200 are electrically connected to each other with the cap layer 310 interposed therebetween.

The first wiring layer 120 is electrically connected to an unillustrated interlayer wiring with the cap layer 110 provided on its lower surface interposed therebetween. The second wiring layer 220 is electrically connected to an unillustrated interlayer wiring with the cap layer 330 provided on its upper surface interposed therebetween.

The cap layers 110, 130, 310 and 330 provided in contact with the first wiring layer 120 and the second wiring layer 320 are respectively ones formed by laminating films with at least TiN as a principal component.

In order to insulate the first wiring layer 120, the second wiring layer 320 and other wiring layers (not shown), the interlayer insulating layers 400, 401 and 402 are respectively provided among the first wiring layer 120, the second wiring layer 320 and other wiring layers (not shown).

The interlayer wiring 200 for connecting the first wiring layer 120 and the second wiring layer 320 is made up of an adhesive layer 210 and a W film 220. The adhesive layer 210 is provided so as to surround a lower surface and side surfaces (surfaces parallel to an axial direction thereof indicated by arrow S) of the W film 220.

Incidentally, the arrow S in FIG. 2 indicates the substrate side, and the direction parallel to the arrow S in FIG. 2 means the direction normal to the surface of a substrate. In FIG. 2 and the drawings described subsequently to FIG. 2, the surface (direction) on the substrate side might be abbreviated as a lower surface (lower side), and the surface (direction) opposite to it might be abbreviated as an upper surface (upper side) for convenience of explanation.

Such a connecting structure between the wiring layers as shown in FIG. 2 is included in the semiconductor device in large numbers. There might be cases in which the rate of occurrence of failures caused by electromigration much varies every individual connecting portions. In this case, a problem takes place in reliability upon design of the semiconductor device if the density of a current caused to flow in each wiring layer is set with each connecting portion hard to develop or cause a failure as the reference. Therefore, a problem arises in that the density of a current caused to flow in each wiring with each connecting portion easy to cause a failure as the reference must be set low.

SUMMARY OF THE INVENTION

The present invention aims to solve the foregoing problems. Namely, the present invention aims to provide a method of manufacturing a semiconductor device, which is capable of reducing variations in the failure incidence at each individual connecting portion lying within the semiconductor device.

The above object is achieved by the present invention mentioned below. Namely, the present invention provides a method of manufacturing a semiconductor device having a structure wherein a first wiring layer and a second wiring layer are electrically connected to each other through an interlayer wiring and cap layers are respectively interposed between the interlayer wiring and the respective wiring layers, comprising the steps of forming a Cu-containing TiN layer serving as each of the cap layers on an Al—Cu wiring corresponding to at least one of the first and second wiring layers by using a Cu-containing Ti target, and heat-treating the Cu contained in the Cu-containing TiN-layer to thereby diffuse the Cu into at least the Al—Cu wiring located in a portion electrically connected to the interlayer wiring.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

<Occurrence of Failures by Electromigration>

Figure 2:
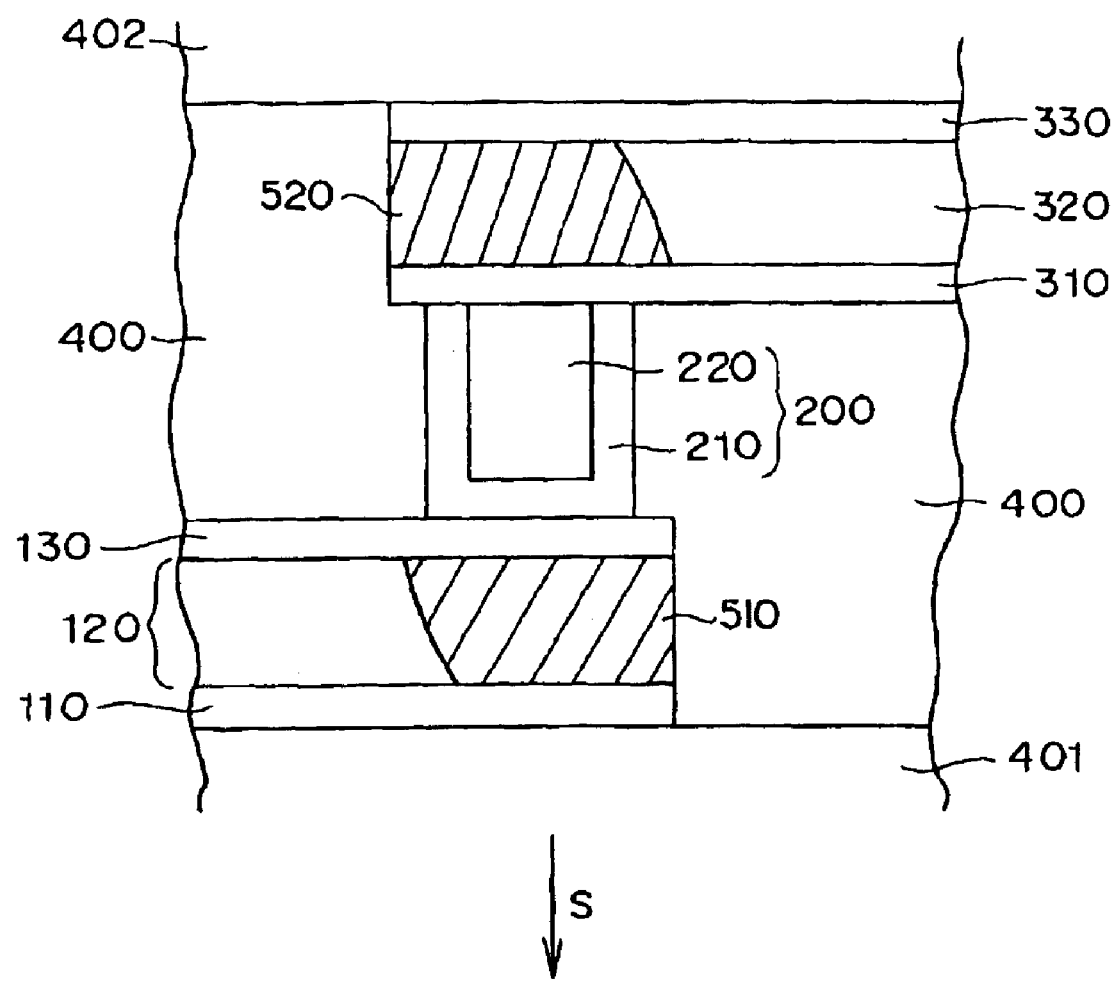
FIG. 2 is a typical cross-sectional view illustrating a partial structure of a semiconductor device having a structure in which wiring layers are laminated.
Figure 3:
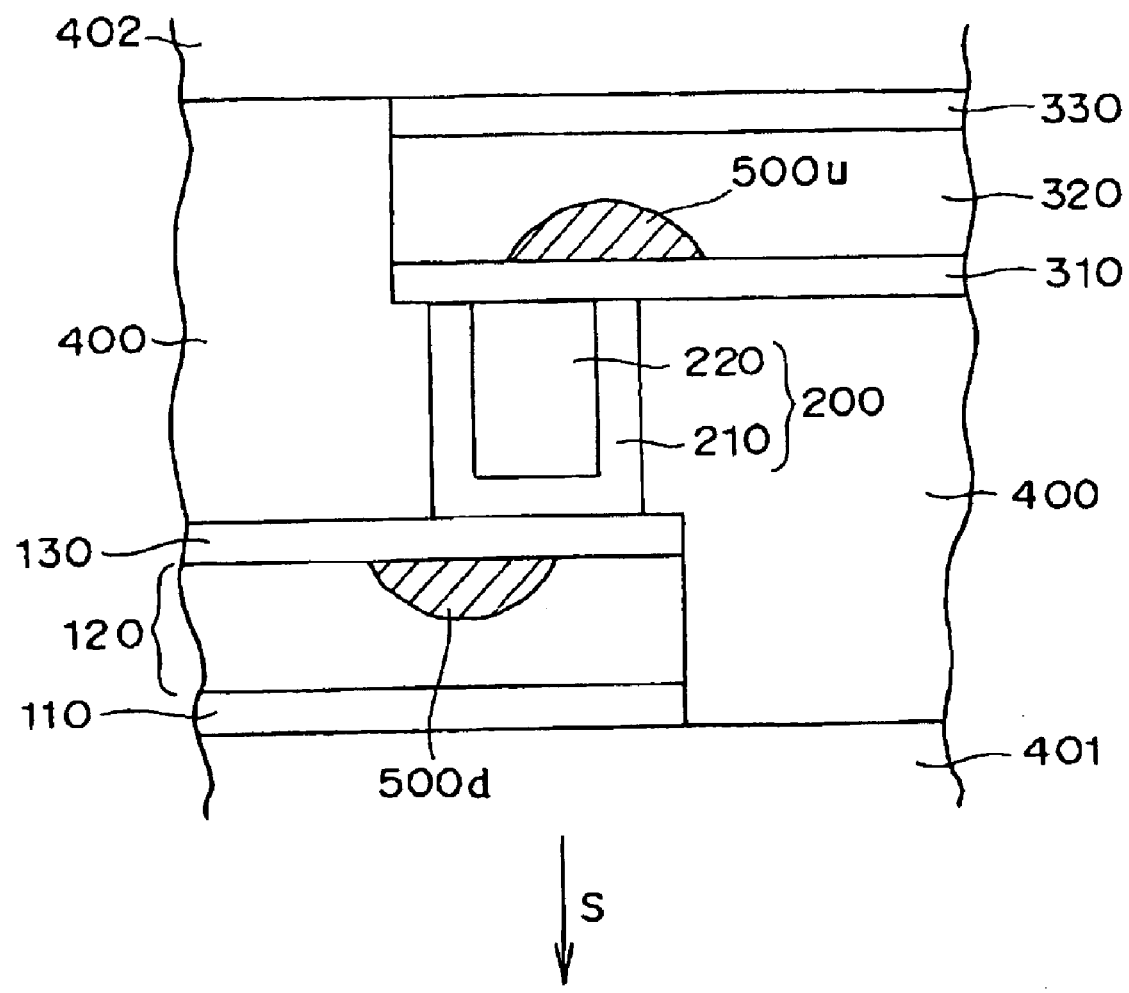
FIG. 3 is a typical cross-sectional view depicting distributions of electron densities in the neighborhood of a connecting portion of the two wiring layers of the semiconductor device shown in FIG. 2.

Failures (such as a short and a break due to the occurrence of Void) caused by electromigration often occur in regions designated at numeral 510 indicative of a first wiring layer 120 and numeral 520 indicative of a second wiring layer 320 in a semiconductor device shown in FIG. 2. This is because since the density of electrons in a region (hereinafter abbreviated as "high electron density region") designated at each of numerals 500$d$ (and 500$u$) is relatively high in each of the first wiring layer 120 (and second wiring layer 320) each made up of an Al—Cu wiring as shown in FIG. 3 when a current flows, a migration of Al atoms is apt to take place. Incidentally, a semiconductor device shown in FIG. 3 is one similar to the semiconductor device shown in FIG. 2.

The present inventors have carried out a detailed investigation of a semiconductor device fabricated by a conventional semiconductor device manufacturing method. As a result, it has been confirmed that a failure is apt to occur in the region designated at numeral 510 rather than that designated at numeral 520, and this cause results from the fact that Cu contained in the Al—Cu wiring is segregated only in the neighborhood (a region spaced away from a portion electrically connected to an interlayer wiring 200) on the substrate side, of the Al—Cu wiring. Accordingly, the present inventors have considered that if the density of Cu in the vicinity of the region other than the neighborhood of the Al—Cu wiring on the substrate side, particularly, the high electron density region 500$d$ can be set larger than ever, then variations in the rate of occurrence of failures or failure incidence at each individual connecting portion lying within the semiconductor device can be reduced. In view of it, the present inventors have invented a semiconductor device manufacturing method of the present invention, which will be descried below.

<Manufacturing Method of Semiconductor Device>

Namely, there is provided a method of manufacturing a semiconductor device, according to the present invention, having a structure wherein a first wiring layer and a second wiring layer are electrically connected to each other with an interlayer wiring interposed therebetween and cap layers are respectively interposed between the interlayer wiring and the respective wiring layers, which comprises a step (hereinafter might be abbreviated as "Cu-containing TiN layer") for forming a Cu-containing TiN layer serving as the cap layer in an Al—Cu wiring corresponding to at least one of the first and second wiring layers by use of a Cu-containing Ti target, and a step (hereinafter might be abbreviated as "thermal diffusion step") for heat-treating the Cu contained in the Cu-containing TiN layer to thereby diffuse the Cu into at least the Al—Cu wiring located in a portion electrically connected to the interlayer wiring.

According to the semiconductor device fabricated by the above-described semiconductor device manufacturing method of the present invention, Cu contained in the Cu-containing TiN layer serving as each cap layer diffuses by heat treatment and migrates toward at least the Al—Cu wiring located in the portion electrically connected to the interlayer wiring in the thermal diffusion step. The semiconductor device manufacturing method according to the present invention will be specifically descried below using the accompanying drawings.

Figure 1:
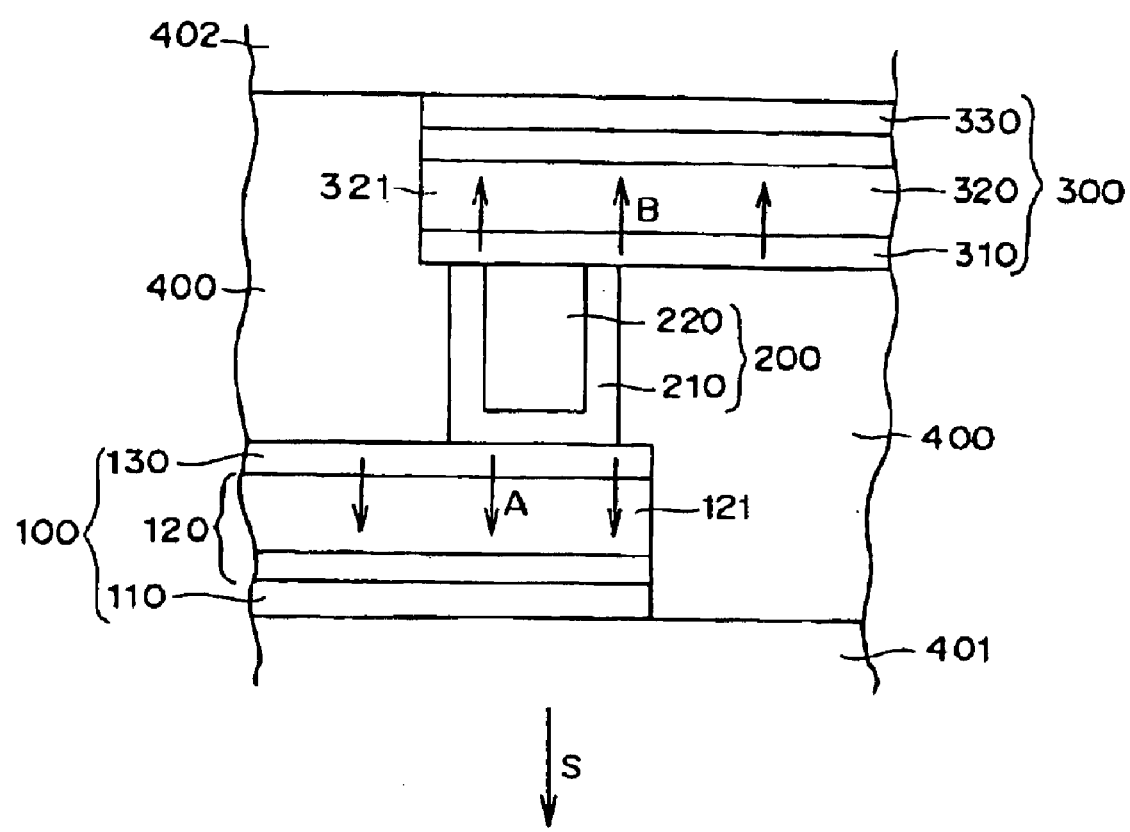
FIG. 1 is a typical cross-sectional view showing one example of a semiconductor device manufactured by a method of manufacturing the semiconductor device, according to the present invention.

FIG. 1 is a typical cross-sectional view showing one example of a semiconductor device fabricated by the semiconductor device manufacturing method of the present invention. Described specifically, the present figure is a typical cross-sectional view illustrating one example of a state in which Cu contained in a Cu-containing TiN layer serving as each cap layer is diffused into an Al—Cu wiring. Incidentally, the semiconductor device shown in FIG. 1 is a semiconductor device having a construction similar to FIG. 2, which is one in which a Cu-containing TiN layer is formed as each of cap layers 130 and 310 by use of a Cu-containing Ti target and which is fabricated through a thermal diffusion step. Reference numeral 121 in FIG. 1 indicates a region (Cu diffusion region) in which Cu contained in the Cu-containing TiN layer (cap layer 130) is diffused. Reference numeral 321 indicates a region (Cu diffusion region) in which Cu contained in the Cu-containing TiN layer (cap layer 310) is diffused. Other reference numerals are similar to those shown in FIG. 2.

As is understood from FIG. 1, the Cu diffusion region 121 is formed so as to include a region for an Al—Cu wiring (first wiring layer 120) located in a portion electrically connected to an interlayer wiring 200. The Cu diffusion region 121 is formed by diffusing Cu contained in the Cu-containing TiN layer (cap layer 130) in a substrate-side direction (in a direction indicated by arrow A in FIG. 1) as viewed from the cap layer 130 side of the Al—Cu wiring (first wiring layer 120) in the thermal diffusion step.

The Cu diffusion region 321 is formed so as to include a region for an Al—Cu wiring (second wiring layer 320) located in a portion electrically connected to the interlayer wiring 200. The Cu diffusion region 321 is formed by diffusing Cu contained in the Cu-containing TiN layer (cap layer 310) in a direction (in a direction indicated by arrow B in FIG. 1) of a cap layer 330 as viewed from the cap layer 310 side of the Al—Cu wiring (second wiring layer 320) in the thermal diffusion step. Incidentally, the Cu diffusion regions 121 and 321 shown in FIG. 1 are typically illustrated as one examples of the Cu-diffused regions for convenience of explanation. The present invention is not limited to the example shown in FIG. 1.

Therefore, Cu sufficiently exists in at least the Al—Cu wiring located in each portion electrically connected to the interlayer wiring in the semiconductor device fabricated by the semiconductor device manufacturing method of the present invention. As is understood from a comparison between FIGS. 1 and 3, the Cu diffusion region 121 (321) and the high electron density region 500$d$ (500$u$) are located in the portion of the first wiring layer 120 (second wiring layer 320) corresponding to at least the Al—Cu wiring, which portion is electrically connected to the interlayer wiring 200. Thus, the semiconductor device fabricated by the semiconductor device manufacturing method of the present invention is capable of further suppressing the migration of Al in the high electron density region 500$d$ and high electron density region 500$u$ as compared with the semiconductor device fabricated by the conventional semiconductor device manufacturing method.

Since the region indicated by the Cu diffusion region 121 was a Cu little-existing region in the semiconductor device fabricated by the conventional semiconductor device manufacturing method as already described, the rate of occurrence of failures or failure incidence in the neighborhood of the portion of the first wiring layer 120, which is electrically connected to the interlayer wiring 200, is further suppressed as compared with that in the neighborhood of the portion of the second wiring layer 320, which is electrically connected to the interlayer wiring 200. Namely, in the example shown in FIG. 1, the failure incidence of the electrically-connected portion (which means the neighborhood of the first wiring layer 120 located in the surface of the interlayer wiring 200 on the substrate side and corresponds to the region designated at numeral 510 in FIG. 2) at which a failure is apt to relatively occur, can be reduced and the reliability of the semiconductor device can thus be enhanced.

Incidentally, while Cu has been diffused in both the Al—Cu wiring provided on the substrate side of the interlayer wiring and the Al—Cu wiring provided on the side opposite to the substrate by use of the semiconductor device manufacturing method of the present invention in the example shown in FIG. 1, Cu may be diffused into the one-sided Al—Cu wiring as needed.

A comparison is made between, for example, a case in which Cu is diffused into the Al—Cu wiring relatively high in failure incidence, i.e., the Al—Cu wiring provided on the interlayer wiring side opposite to the substrate by use of the semiconductor device manufacturing method of the present invention and a case different from that. Consequently, when the difference in the rate of failure occurrence is not so made, Cu may preferably be diffused into only the Al—Cu wiring relatively high in failure incidence, i.e., the Al—Cu wiring provided on the substrate side of the interlayer wiring (this corresponds to the formation of the Cu diffusion region 121 alone in the example shown in FIG. 1).

In this case, the reliability of the semiconductor device can be enhanced substantially equivalently to the case in which Cu has been diffused into both the Al—Cu wiring provided on the substrate side of the interlayer wiring and the Al—Cu wiring provided on the side opposite to the substrate. Further, a semiconductor device manufacturing process can be further simplified.

By heat treatment, Cu contained in the Cu-containing TiN film may preferably be diffused into the neighborhood of a cap-layer interface in the Al—Cu wiring located in each portion electrically connected to at least the interlayer wiring. In such a case, the density of Cu contained in the neighborhood of the cap-layer interface in the Al—Cu wiring can be made higher (this is equivalent to the case in which the density of Cu in the neighborhood of the Cu diffusion region 121 (321) on the cap layer 130 (310) side is made higher in the example shown in FIG. 1). In this case, the migration of Al atoms in the vicinity of the high electron density region 500d in particular can be suppressed more effectively. As a result, variations in the failure incidence at each individual connecting portion in the semiconductor device can be suppressed more effectively.

Incidentally, density distributions of Cu diffused into the Al—Cu wirings and their diffusion regions (corresponding to the Cu diffusion regions 121 and 321 in the example shown in FIG. 1, for example) can be controlled by adjusting the densities of Cu contained in the Cu-containing TiN layers prior to the thermal diffusion step, heat treatment conditions at the execution of the thermal diffusion step, etc.

The aforementioned semiconductor device manufacturing method of the present invention will be described in more detail with being broadly divided into the Cu-containing TiN layer forming step and the thermal diffusion step.

-Cu-Containing TiN Layer Forming Step-

In the Cu-containing TiN layer forming step, a Cu-containing Ti target is used as a target used to form a Cu-containing TiN layer. Only one sheet of the Cu-containing Ti target may be used but two or more sheets of Cu-containing Ti targets may be used.

Incidentally, the term "Cu-containing Ti target" in the present invention means a target which contains both Cu and Ti when one sheet of Cu-containing Ti target is used. When two or more sheets of Cu-containing Ti targets are used, this means that Cu and Ti are contained in any of the targets. Cu and Ti may be contained in the same target or may be respectively contained in discrete targets. Incidentally, other materials may be used as the material for constituting the target if necessary except for Cu and Ti.

As specific examples of the target containing both Cu and Ti, may be mentioned a target made of a mixture of Ti and Cu and a target in which a piece of Cu is provided on the surface of a Ti plate.

As the target constituted of the mixture of Ti and Cu, may be mentioned one comprised of a sintered body of Ti power and Cu powder and one comprised of an alloy (solid solution) of Ti and Cu. These targets can be fabricated by the known method. Adjusting the content of cu contained in each target makes it easy to control a Cu content in a thin film formed using the target.

Such a target comprised of the mixture of Ti and Cu is one in which at least Cu is contained in Ti or a matrix with Ti as a principal component. The content of Cu in the target may preferably be 1 wt % or more, more preferably, 2 wt % or more. When the content of Cu contained in the target is less than 1 wt %, the rate of occurrence of failures by electromigration at each connecting portion in the semiconductor device might widely vary.

On the other hand, although the upper limit of the Cu content is not limited in particular, it may preferably be 5 wt % or less. There may be a case in which when the upper limit thereof exceeds 5 wt %, an alloy of Ti and Cu is much contained in a film grown using this target, so that patterning of each Cu-containing TiN layer (cap layer) falls into difficulties.

Incidentally, the degree of purity of the material constituting such a target may preferably be equal to or greater than a level used as a normal target material.

When the target in which the piece of Cu is provided on the surface of the Ti plate, is used, there is a need to provide the piece of Cu provided on the surface of the Ti plate at at least an erosion portion (corresponding to a region to be sputtered) of the target. As a specific example of such a target, may be mentioned, for example, a target or the like in which pieces of Cu of about a few $mm^2$ to about 1 $cmm^2$ are attached to or embedded in the surface of a Ti plate at predetermined intervals. The piece of Cu is not limited to the above-described square chip-like one. If ones such as a Cu line capable of being attached to or embedded in the surface of a Ti plate are taken, then ones having arbitrary shapes may be used.

Such a target with the piece of Cu provided on the surface of the Ti plate has the merit of being capable of being re-used as a Cu-containing Ti target by simply attachment of the piece of Cu to the already-existing Ti target.

Incidentally, the rate of the area of a portion in which Ti provided on a target surface is exposed, to the area of a portion in which Cu provided thereon is exposed, may preferably be adjusted so that at least Cu is contained 1 wt % or more within a thin film formed using such a target with the piece of Cu provided on the surface of the Ti plate.

The degree of purity of each of the Ti plate and the piece of Cu may preferably be equal to or greater than the level used as the normal target material.

On the other hand, when the two or more sheets of Cu-containing Ti targets are used to form the Cu-containing TiN layer, Cu and Ti may be assuredly contained in any of the targets as described above. Further, the Ti-containing target, the Cu-containing target, the above-described target comprised of the mixture comprised of Ti and Cu, and the above target with the piece of Cu provided on the surface of the Ti plate can be utilized two or more in combination.

Thus, when, for example, Cu-containing TiN layers relatively thick in thickness are formed by using a deposition apparatus with cathodes respectively provided in a plurality of chambers, two sheets of targets each comprised of a mixture of Ti and Cu can be respectively mounted to the two cathodes and thereby sputtered in twice. It is therefore possible to prevent a reduction in tact time. On the other hand, when a Cu-containing TiN layer relatively thin in thickness is formed, a sheet of target comprised of a mixture of Ti and Cu is attached to one cathode so that its sputtering can be performed. Therefore, the cathode used upon the formation of the Cu-containing TiN layer may be one alone. When all the cathodes lying within the deposition apparatus are used upon manufacture of the semiconductor device, it becomes easy to ensure the corresponding cathodes available to the deposition or growth of layers other than the Cu-containing TiN layer.

When two sheets of targets included in targets separately provided with Ti and Cu are used as Cu-containing Ti targets to form Cu-containing TiN layers, a first target containing Ti and a second target containing Cu can be sputtered simultaneously.

Such sputtering using the first target containing Ti and the second target containing Cu is suitable for use of a deposition apparatus capable of co-sputtering.

Incidentally, a discharge condition for the Ti-containing target and the Cu-containing target may preferably be adjusted so that at least Cu is contained 1 wt % or more in thin films formed using these two targets.

As the above-described sputtering performed using the Cu-containing Ti targets upon formation of the Cu-containing TiN layers, may be used any one if the known sputtering methods are taken. For instance, a DC magnetron sputtering method or the like widely used in sputtering of a target having conductivity can be used. A sputtering condition for gas pressure, discharge power and the like can be adjusted within a stable sputterable range in an atmosphere of a mixed gas of Ar and $N_2$ according to various characteristics of a desired Cu-containing TiN layer, a sputtering method and system to be used, the number of targets and the type of target, etc.

Incidentally, each of the cap layers is not limited in particular if one containing a Cu-containing TiN layer formed using a Cu-containing Ti target is adopted. The cap layer may be made up of the Cu-containing TiN layer alone but may be one comprised of a multilayer film containing the Cu-containing TiN layer. Incidentally, when the cap layer is made up of the multilayer film, layers other than the Cu-containing TiN layer may contain Cu.

When the cap layer is made up of the Cu-containing TiN layer alone, the productivity of the semiconductor device can be enhanced. When the cap layer is comprised of the multilayer film containing the Cu-containing TiN layer, a cap layer having a desired characteristic can be formed easier.

When the cap layer is made up of the multilayer film containing the Cu-containing TiN layer, a layer provided in contact with an Al—Cu wiring may preferably be a Cu-containing TiN layer formed using a Cu-containing Ti target. Since the Cu-containing TiN layer and the Al—Cu wiring are provided in contact with each other in this case, it is easy to diffuse Cu contained in each Cu-containing TiN layer into the Al—Cu wiring.

-Thermal Diffusion Step-

The thermal diffusion step can be executed while the Cu-containing TiN layers are being formed or after the formation of the Cu-containing TiN layers.

When the thermal diffusion step is performed while the Cu-containing TiN layers are being formed, heat treatment may be carried out while the Cu-containing TiN layers are being formed. When the thermal diffusion step is performed after the formation of the Cu-containing TiN layers, the heat treatment may be performed at any given time after at least the formation of the Cu-containing TiN layers has completed. Since there is no need to newly set heat treatment for diffusing Cu in the case of the former, the productivity of the semiconductor device can be enhanced. In the case of the latter, a heat treatment condition can be easily adjusted in such a way that a density distribution of Cu diffused into each Al—Cu wiring reaches a desired density distribution.

Incidentally, when the interlayer wiring is formed by at least a CVD method through a step for growing or depositing a W film, the W film is grown while being heat-treated at a high temperature. Therefore, Cu contained in the Cu-containing TiN layers can be diffused into their corresponding Al—Cu wirings through the use of the heat treatment at the deposition of the W film. Thus, the formation of the W film for the interlayer wiring and the thermal diffusion step can be performed simultaneously without adding new heat treatment for the purpose of Cu diffusion alone in the manufacturing process of the semiconductor device.

Although the temperature of the heat treatment carried out in the thermal diffusion step is not restricted in particular, the heat-treatment temperature may preferably range from 200° C. to 450° C., more preferably, 300° C. to 400° C. Incidentally, when the time necessary for the heat treatment is relatively short, the heat-treatment temperature may preferably be 400° C. or more.

When the heat-treatment temperature is less than 200° C., there may be cases in which Cu contained in the Cu-containing TiN layers cannot be sufficiently diffused into the Al—Cu wirings and the time required to perform the heat treatment becomes excessively long. There may also be a case in which when the heat-treatment temperature exceeds 450° C., Cu is diffused into the whole span of each Al—Cu wiring so that the density of Cu contained in the neighborhood of the cap-layer interface in each Al—Cu wiring cannot be sufficiently obtained, whereby it becomes hard to suppress the generation of electromigration.

-Specific Example of Manufacturing Process of Semiconductor Device-

One example of the manufacturing process of the semiconductor device, using the foregoing semiconductor device manufacturing method of the present invention will next be described specifically using the drawings. However, the present invention is not necessarily limited to the following specific example alone.

Figure 4:
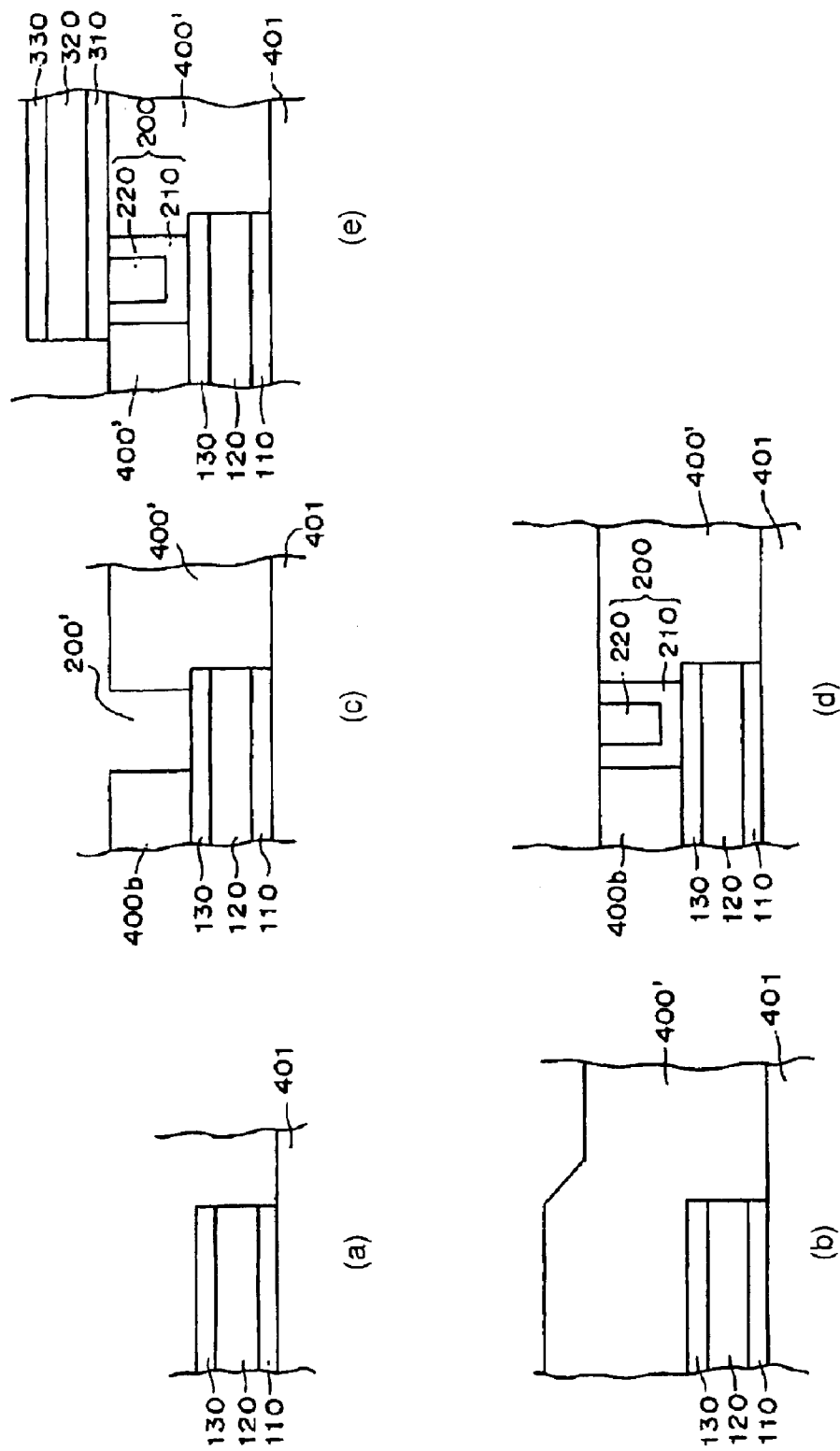
FIG. 4 is a typical cross-sectional view for describing a fabrication process of forming the two wiring layers of the semiconductor device shown in FIG. 2 and an interlayer wiring for connecting these wiring layers.

FIG. 4 is a typical cross-sectional view for describing a fabrication process of forming the two wiring layers of the semiconductor device shown in FIG. 2 and an interlayer wiring for connecting these wiring layers, wherein FIG. 4(a) shows a step for depositing or growing a first wiring layer and two cap layers provided in contact with it on the surface of a first interlayer insulating layer or the surface of a substrate and patterning them, FIG. 4(b) shows a step for forming a second interlayer insulating layer on the cap layer provided on the upper surface of the first wiring layer, FIG. 4(c) shows a step for planarizing the surface of the second interlayer insulating layer and thereafter defining a through hole therein, FIG. 4(d) shows a step for forming an interlayer wiring in the through hole, and FIG. 4(e) shows a step for growing a second wiring layer and two cap layers provided in contact with the same on the surface of the second interlayer insulating layer, which is formed with the interlayer wiring and patterning these layers, respectively.

Incidentally, reference numeral 200' in FIG. 4 indicates a through hole, reference numeral 400 indicates a first interlayer insulating layer (or substrate), and reference numeral 400' indicates a second interlayer insulating layer, respectively. Portions designated at numerals other than those respectively indicate ones similar to those designated at numerals shown in FIG. 2.

First of all, a cap layer 110, a first wiring layer 120 and a cap layer 130 are grown on the surface of the first interlayer insulating layer (or substrate) 401 in this order by the known vapor phase deposition method, preferably, the sputtering method. Thereafter, these three layers are subjected to patterning processing using a photolithography method and an etching method to thereby form desired patterns.

At this time, in the conventional semiconductor device manufacturing method, the first wiring layer 120 has been grown by generally sputtering an Al target containing Cu of about 0.5 wt %, and Cu has been added into the first wiring layer 120 through such a process. By sputtering a Ti target, the cap layer 130 has been grown as a single layer or a multilayer film with at least TiN as a principal component.

Even in the case of the semiconductor device manufacturing method of the present invention, the first wiring layer 120 and the cap layer 130 are formed according to the above-described process substantially identical to the conventional one. In the present invention, however, the cap layer 130 contains a Cu-containing TiN layer, and a target used to form the Cu-containing TiN layer makes use of such a Cu-containing Ti target (such as a target comprised of a sintered body of Ti power and Cu power) as already described without using the Ti target. Accordingly, Cu is contained in the cap layer 130 formed by the semiconductor device manufacturing method of the present invention.

Thus, the first wiring layer 120 is formed on the surface of the first interlayer insulating layer (or substrate) 401 as shown in FIG. 4(a). Incidentally, FIG. 4(a) shows one end of the first wiring layer 120 subjected to patterning.

Next, as shown in FIG. 4(b), a second interlayer insulating layer 400' is grown on the first wiring layer 120 and the surface of the first interlayer insulating layer (or substrate) 401, which has been exposed by patterning processing, by using the known vapor phase deposition method, preferably, the CVD method. Since, at this time, the second interlayer insulating layer 400' formed just above the neighborhood of an end of the first wiring layer 120 has a surface with depressions and projections, the surface of the second interlayer insulating layer 400' is planarized by a CMP method (Chemical Mechanical Polishing method) or an etchback method.

After its planarization, as shown in FIG. 4(c), a hole (through hole 200') is defined in part of the second interlayer insulating layer 400' in a vertical direction by use of the photolithography method and etching until a topside portion of the first wiring layer 120 in the neighborhood of the end thereof is exposed.

Thereafter, an adhesive layer 210 with TiN and/or Ti as a principal component is deposited so as to cover a lower surface and a side face lying within the through hole 200' by the known vapor phase deposition method, preferably, the sputtering method. Afterwards, a W film 220 is further grown so as to bury the through hole 200' by the known vapor phase deposition method, preferably, the CVD method (Chemical Vapor Deposition method). After its growth, a metal film formed at a location other than the interior of the through hole 200' is removed by the CMP method or the etchback method to thereby form an interlayer wiring 200 as shown in FIG. 4(d).

Incidentally, when the W film 220 is grown by the CVD method, it is grown while being heat-treated at a high temperature ranging from about 400° C. to about 450° C. Thus, in the semiconductor device manufacturing method of the present invention in such a case, Cu contained in the cap layer 130 containing the Cu-containing TiN layer can be diffused into a region in the first wiring layer 120, other than the neighborhood thereof on the substrate side through the use of heat added to the substrate.

In the case of the semiconductor device fabricated by the conventional semiconductor device manufacturing method, the density of Cu in the region in the first wiring layer 120, which is other than the neighborhood thereof on the substrate side after the completion of the thermal diffusion step, shows a level at which the existence thereof per se can hardly be confirmed. However, in the case of the semiconductor device fabricated by the semiconductor device manufacturing method of the present invention, the maximum density of Cu can be set to at least 0.5 at % or more. Therefore, electromigration in the region in the first wiring layer 120, which is other than the neighborhood thereof on the substrate side after the completion of the thermal diffusion step, is suppressed more than ever, so that the occurrence of failures can be curbed.

Incidentally, the heat treatment is not limited to the case in which the W film 220 is grown by the CVD method referred to above. This can be achieved even by, for example, heat treatment of Cu contained in the Cu-containing TiN layer to a temperature (e.g., about 350° C.) enabling diffusion of Cu into the Al—Cu wiring in the course of deposition of the Cu-containing TiN layer, etc.

Next, as shown in FIG. 4(e), a cap layer 310, a second wiring layer 320 and a cap layer 330 are deposited over the surfaces of the interlayer wiring 200 and the second interlayer insulating layer 400' in this order by the known vapor phase deposition method, preferably, the sputtering method. Further, these three layers are subjected to patterning processing by the photolithography method or the like so as to obtain desired patterns. Consequently, the cap layer 310, the second wiring layer 320 and the cap layer 330 are formed so as to completely cover at least the upper surface of the interlayer wiring 200. At this time, the cap layer 330 is also grown by the semiconductor device manufacturing method of the present invention in a manner similar to the cap layer 130.

By repeating the steps shown in FIGS. 4(a) through 4(e) in this way, a semiconductor device having a multilayered wiring structure in which wiring layers are laminated on a substrate, is fabricated.

<Embodiment>

Figure 5:
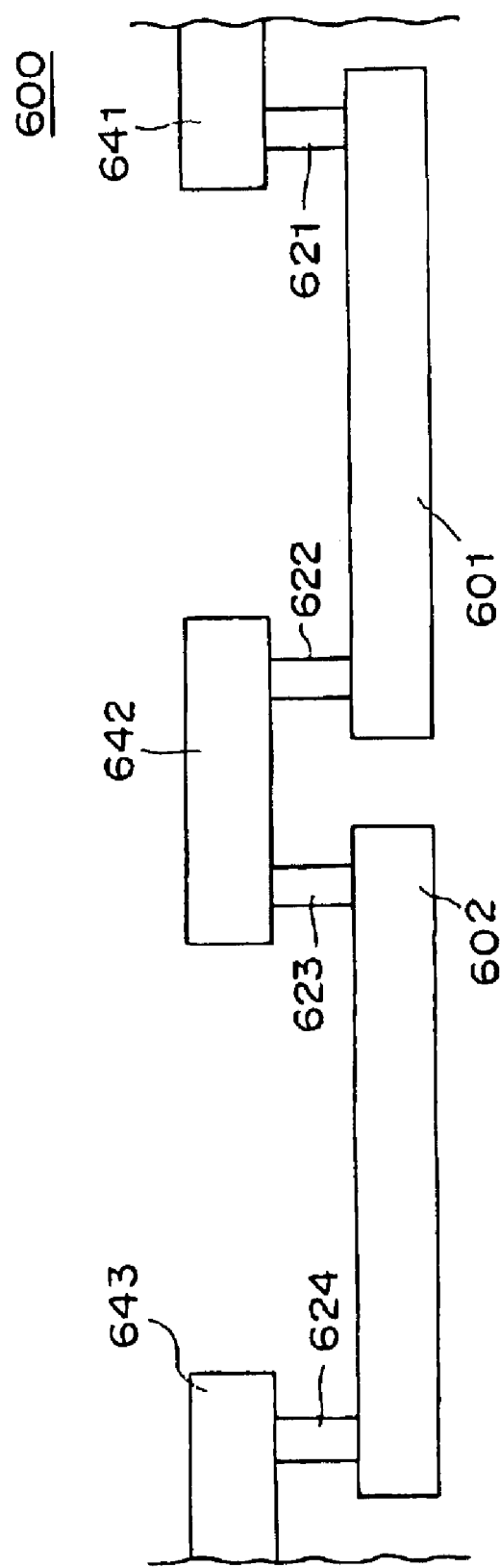
FIG. 5 is a typical cross-sectional view showing a wiring structure of a semiconductor device having two wiring layers used to evaluate a cumulative failure incidence caused by electromigration.

An embodiment has been achieved by evaluating the cumulative incidence of failures when a semiconductor device having a configuration shown in FIG. 5, which has been fabricated by the semiconductor device manufacturing method of the present invention and the conventional semiconductor device manufacturing method, is consecutively energized.

FIG. 5 is a typical cross-sectional view of a wiring structure employed in a semiconductor device having wiring layers of two layers used to evaluate the cumulative incidence of failures caused by electromigration.

The semiconductor device 600 shown in FIG. 5 comprises wiring layers each corresponding to a first layer, which are designated at numerals 601 and 602, interlayer wirings designated at numerals 621, 622, 623 and 624, and wiring layers each corresponding to a second layer, which are designated at numerals 641, 642 and 643.

Incidentally, the side of the wiring layers 601 and 602 each corresponding to the first layer with respect to the interlayer wirings 621, 622, 623 and 624 means the substrate side (lower side), and the description of interlayer insulating layers and a substrate are omitted for convenience of illustration.

Each of structures of the wiring layers 601 and 602 each corresponding to the first layer and the wiring layers 641, 642 and 643 each corresponding to the second layer is equivalent to one wherein cap layers are provided on upper and lower surfaces of an Al—Cu wiring. Each of structures of the interlayer wirings 621, 622 and 623 is similar to the interlayer wiring 200 shown in FIG. 2.

The length of each of the wiring layers 601 and 602 each corresponding to the first layer is 100 μm and set so as to be sufficiently greater than a Blech length. The length of each of the wiring layers 641, 642 and 643 each corresponding to the second layer is 5 μm and set so as to be sufficiently smaller than the Blech length.

The widths of the wiring layers 601 and 602 each corresponding to the first layer and the wiring layers 641, 642 and 643 each corresponding to the second layer are respectively 2 μm. A layer structure thereof is one formed by laminating a TiN layer (whose thickness is 70 nm), a Ti layer (whose thickness is 5 nm), an Al—Cu wiring (400 nm), a Ti layer (whose thickness is 5 nm), a TiN layer (20 nm), and a Ti layer (whose thickness is 30 nm) in order from above.

The wiring layer 601 has one end whose upper surface is connected to a lower surface of one end of the wiring layer 641 by the interlayer wiring 621, and another one end whose upper surface is connected to a lower surface of one end of the wiring layer 642 by the interlayer wiring 622.

Further, the wiring layer 602 has one end whose upper surface is connected to a lower surface of an end of the wiring layer 642 by the interlayer wiring 623, which end is located on the side disconnected from the wiring layer 601, and another one end whose upper surface is connected to a lower surface of one end of the wiring layer 643 by the interlayer wiring 624.

Incidentally, the interlayer wirings 621, 622, 623 and 624 are ones wherein interlayer wirings each having a diameter of 0.26 μm are arranged in parallel in a width direction (in a direction normal to the sheet in FIG. 5) of each wiring layer with four as a pair.

Semiconductor devices according to an embodiment 1 and a comparative example 1 respectively include such a repeated wiring structure as shown in the semiconductor device 600 depicted in FIG. 5 by the same repetitive units and have substantially the same configurations. Further, the semiconductor devices according to the embodiment 1 and the comparative example 1 were fabricated through the already-described manufacturing process shown in FIG. 4 in a similar manner except for the deposition or growth of cap layers to be described below.

Deposition of Cap Layers

Comparative Example 1

Upon fabrication of the semiconductor device according to the comparative example 1, the growth of cap layers (not shown) of the wiring layers 601 and 602 was done by sputtering Ti targets.

(Embodiment 1)

Upon fabrication of the semiconductor device according to the embodiment 1, the growth of cap layers (not shown) of the wiring layers 601 and 602 was done by sputtering Ti targets each containing Cu of 5 wt % under a sputtering condition substantially identical to the comparative example 1.

-Evaluation-

The evaluation of cumulative incidences of failures caused by electromigration was done by continuously energizing the semiconductor devices according to the embodiment 1 and the comparative example 1 with a current having a current density of $1.5 \times 10^6$ A/cm$^2$ at a temperature of 200° C. and measuring their energization times until resistance values thereof respectively reach a value with a 10% increase in initial resistance value with the occurrence of deficiency of Al atoms in wirings layers by electromigration.

Figure 6:
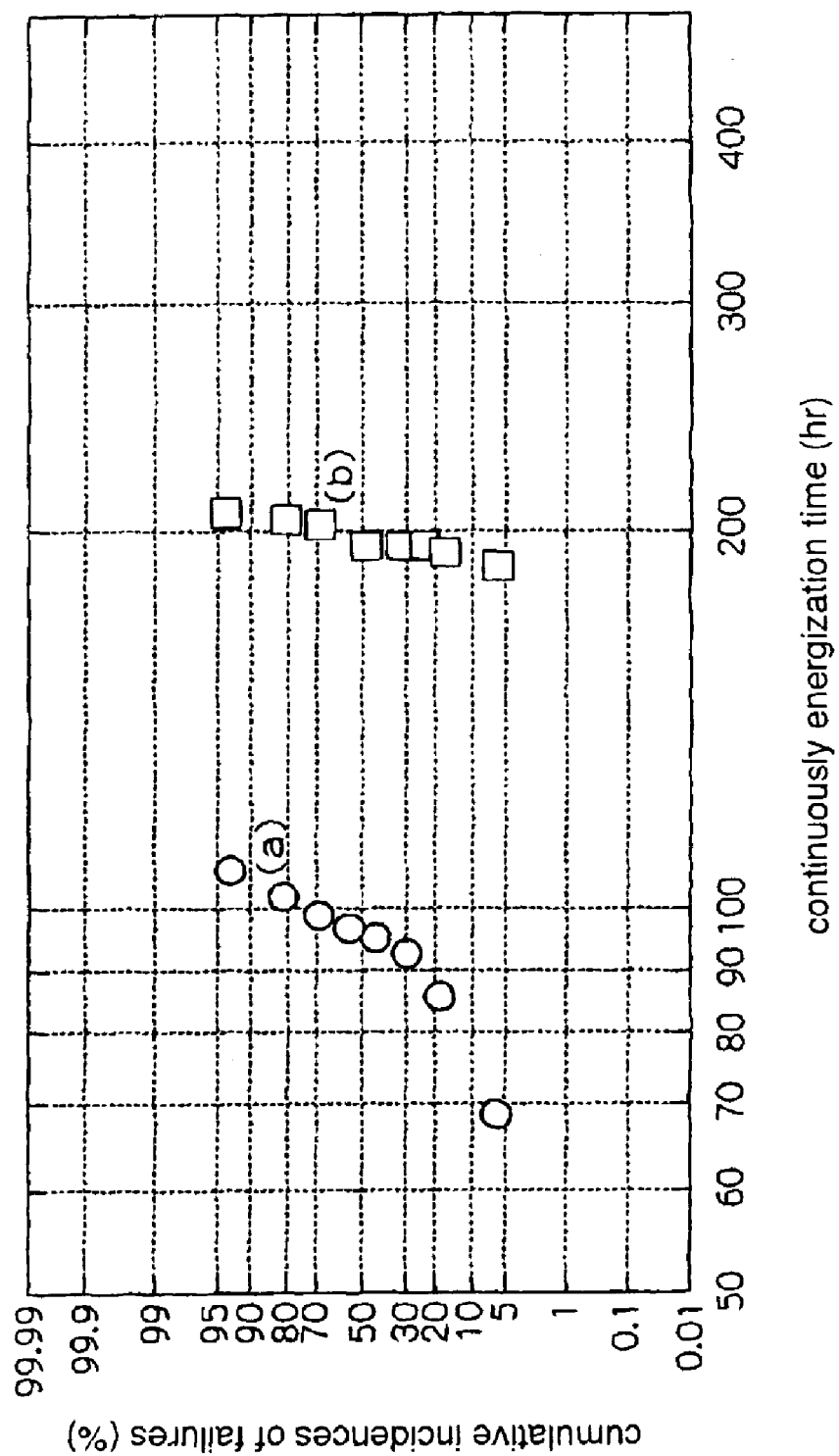
FIG. 6 is a graph showing cumulative failure incidences at the time that semiconductor devices according to an embodiment 1 and a comparative example 1 are consecutively energized.

FIG. 6 is a graph showing the cumulative incidences of failures at the time that the semiconductor devices according to the embodiment 1 and the comparative example 1 are consecutively energized. In FIG. 6, marks "○" indicate a tendency of a cumulative incidence of failures (%) to a continuous energization time (hr) of the semiconductor device 600 according to the comparative example 1, and marks "□" indicate a tendency of a cumulative incidence of failures (%) to a continuous energization time (hr) of the semiconductor device 700 according to the embodiment 1.

As is understood from FIG. 6, the semiconductor device according to the embodiment 1 has a continuous energization time elapsing before a constant cumulative failure incidence, which is equivalent to about twice the continuous energization time of the semiconductor device according to the comparative example 1 as compared with the semiconductor device according to the comparative example 1. Consequently, the reliability of the semiconductor device according to the embodiment 1 was enhanced.

According to the present invention as described above, there can be provided a method of manufacturing a semiconductor device, which is capable of reducing variations in the rate of occurrence of failures at individual connecting portions in the semiconductor device.

While the present invention has been described with reference to the illustrative embodiments, this description is not intended to be construed in a limiting sense. Various modifications of the illustrative embodiments will be apparent to those skilled in the art on reference to this description. It is therefore contemplated that the appended claims will cover any such modifications or embodiments as fall within the true scope of the invention.

What is claimed is:

1. A method of manufacturing a semiconductor device having a structure wherein a first wiring layer and a second wiring layer are electrically connected to each other through an interlayer wiring and cap layers are respectively interposed between the interlayer wiring and the respective wiring layers, comprising the steps of:

forming a Cu-containing TiN layer serving as each of the cap layers on an Al—Cu wiring corresponding to at least one of the first and second wiring layers by using a Cu-containing Ti target; and heat-treating the Cu contained in the Cu-containing TiN layer to thereby diffuse the Cu into at least the Al—Cu wiring located in a portion electrically connected to the interlayer wiring.

2. The method according to claim 1, wherein the Cu contained in the Cu-containing TiN layer is diffused into the neighborhood of a cap-layer interface in at least the Al—Cu wiring located in the portion electrically connected to the interlayer wiring by heat treatment.

3. The method according to claim 1, wherein the Cu-containing Ti target is a target comprised of a mixture of Ti and Cu.

4. The method according to claim 3, wherein the target comprised of the mixture of Ti and Cu is a sintered body of Ti power and Cu powder.

5. The method according to claim 3, wherein the target comprised of the mixture of Ti and Cu is an alloy of Ti and Cu.

6. The method according to claim 3, wherein the target comprised of Ti and Cu contains Cu of 1 wt % or more.

7. The method according to claim 1, wherein the Cu-containing Ti target is at least a target in which a piece of Cu is provided on the surface of a Ti plate.

8. The method according to claim 1, wherein said step for forming the Cu-containing TiN layer serving as each of the cap layers on the Al—Cu wiring corresponding to at least one of the first and second wiring layers by using the Cu-containing Ti target is performed by using a first target containing Ti and a second target containing Cu as the Cu-containing Ti targets and simultaneously sputtering the first target and the second target.

9. The method according to claim 1, wherein each of the cap layers is made up of a multilayer film of two or more layers, and at least either one layer of the multilayer film is a Cu-containing Ti layer formed using the Cu-containing Ti target.

10. The method according to claim 9, wherein the layer in the multilayer film, which is provided in contact with the surface of the Al—Cu wiring, is a Cu-containing Ti layer formed using the Cu-containing Ti target.

11. The method according to claim 1, wherein after execution of said step for forming the Cu-containing TiN layer serving as each of the cap layers on the Al—Cu wiring corresponding to at least one of the first and second wiring layers by using the Cu-containing Ti target, said step for heat-treating the Cu contained in the Cu-containing TiN layer to thereby diffuse the Cu into at least the Al—Cu wiring located in the portion electrically connected to the interlayer wiring is executed.

12. The method according to claim 1, wherein while said step for forming the Cu-containing TiN layer serving as each of the cap layers on the Al—Cu wiring corresponding to at least one of the first and second wiring layers by using the Cu-containing Ti target is being performed, said step for heat-treating the Cu contained in the Cu-containing TiN layer to thereby diffuse the Cu into at least the Al—Cu wiring located in the portion electrically connected to the interlayer wiring is executed.

13. The method according to claim 1, wherein the interlayer wiring is formed through a step for growing a W film by at least a CVD method, and said step for heat-treating the Cu contained in the Cu-containing TiN layer to thereby diffuse the Cu into at least the Al—Cu wiring located in the portion electrically connected to the interlayer wiring is executed while the W film is being formed.

14. The method according to claim 1, wherein said step for heat-treating the Cu contained in the Cu-containing TiN layer to thereby diffuse the Cu into at least the Al—Cu wiring located in the portion electrically connected to the interlayer wiring is executed within a temperature range of 200° C. to 450° C.

15. The method according to claim 2, wherein the Cu-containing Ti target is a target comprised of a mixture of Ti and Cu.

16. The method according to claim 2, wherein the Cu-containing Ti target is at least a target in which a piece of Cu is provided on the surface of a Ti plate.

17. The method according to claim 2, wherein said step for forming the Cu-containing TiN layer servings each of the cap layers on the Al—Cu wiring corresponding to at least one of the first and second wiring layers by using the Cu-containing Ti target is performed by using a first target containing Ti and a second target containing Cu as the Cu-containing Ti targets and simultaneously sputtering the first target and the second target.

18. The method according to claim 2, wherein each of the cap layers is made up of a multilayer film of two or more layers, and at least either one layer of the multilayer film is a Cu-containing Ti layer formed using the Cu-containing Ti target.

19. The method according to claim 2, wherein after execution of said step for forming the Cu-containing TiN layer serving as each of the cap layers on the Al—Cu wiring corresponding to at least one of the first and second wiring layers by using the Cu-containing Ti target, said step for heat-treating the Cu contained in the Cu-containing TiN layer to thereby diffuse the Cu into at least the Al—Cu wiring located in the portion electrically connected to the interlayer wiring is executed.

20. The method according to claim 2, wherein while said step for forming the Cu-containing TiN layer serving as each of the cap layers on the Al—Cu wiring corresponding to at least one of the first and second wiring layers by using the Cu-containing Ti target is being performed, said step for heat-treating the Cu contained in the Cu-containing TiN layer to thereby diffuse the Cu into at least the Al—Cu wiring located in the portion electrically connected to the interlayer wiring is executed.

* * * * *